United States Patent [19]
Lohmann

[11] 3,949,311
[45] Apr. 6, 1976

[54] RING COUNTERS WITH SYNCHRONOUSLY CONTROLLED COUNTING FLIP-FLOPS

[75] Inventor: Heinz-Juergen Lohmann, Braunschweig, Germany

[73] Assignee: Siemens Aktiengesellschaft, Berlin & Munich, Germany

[22] Filed: Jan. 20, 1975

[21] Appl. No.: 542,358

[30] Foreign Application Priority Data
Feb. 27, 1974 Germany............................ 2409392

[52] U.S. Cl............. 328/43; 307/223 R; 307/224 R
[51] Int. Cl.² .................. H03K 21/02; H03K 23/04
[58] Field of Search ........ 307/221 R, 223 R, 224 R; 328/43

[56] References Cited
UNITED STATES PATENTS

| | | | |
|---|---|---|---|
| 3,105,195 | 9/1963 | Hornoch................................ | 328/43 |
| 3,798,554 | 3/1974 | Sadlack.................................. | 328/43 |
| 3,811,092 | 5/1974 | Charbonnier.......................... | 328/43 |

*Primary Examiner*—Stanley D. Miller, Jr.
*Attorney, Agent, or Firm*—Hill, Gross, Simpson, Van Santen, Steadman, Chiara & Simpson

[57] ABSTRACT

A ring counter has a plurality of synchronously controlled counting flip-flops. Each of the flip-flops are constructed as a masterslave flip-flop with a majority decision input circuit with three input variables. An even number of the counting flip-flops, which operate in accordance with the Boolean equation Qtl = S . R + Qto . (S + R) are ring connected by way of their set inputs and the outputs associated with the set inputs. The reset inputs of the counting flip-flops of an even order, and of an uneven order, are connected with first and second control lines, respectively, for receiving counting information and negated counting information, respectively. The counting information for the first counting flip-flop is supplied and emitted with inversion. A binary divider controlled by counting pulses is connected to the first control line and its output information signals reach the first control line directly as counting information, while at the same time the counting information is supplied in an inverted form to the second control line. The ring counters are constructed very simply in an advantageous manner. Dynamic rectangular signals can be processed as counting pulses and their logical values are respectively provided by their phase position. If counting pulses are utilized having a logical value which is given by the respective signal amplitude, only one additional inverter must be provided with each counting flip-flop. Advantageously, the ring counters can be utilized for different signal shapes as counting pulses.

5 Claims, 7 Drawing Figures

|   | MG1 | MG2 | MG3 | A |
|---|---|---|---|---|
| I | O | O | O | L |
|   | O | O | L | L |
|   | L | O | O | L |
|   | L | O | L | O |
| II | O | L | O | L |
|   | O | L | L | O |
|   | L | L | O | O |
|   | L | L | L | O |

RING COUNTERS WITH SYNCHRONOUSLY CONTROLLED COUNTING FLIP-FLOPS

BACKGROUND OF THE INVENTION

1. Field of the Invention

This invention relates to ring counter structures, and more particularly to ring counters having synchronously controlled counting flip-flops, the flip-flops each being constructed of a masterslave flip-flop with a majority decision input circuit for three variables. Two of these variables are applied to the set and reset inputs, while the third variable is obtained as the output of the slave. The majority decision circuit is directly connected to the set input of the master and indirectly to the reset input of the master by way of an inverter so that the counting flip-flop operates in accordance with the truth table

| S | R | Qto | Qtl |
|---|---|-----|-----|
| L | O | O   | O   |
| L | L | O   | L   |
| O | L | L   | L   |
| O | O | L   | O   |
| L | O | L   | L   |
| L | L | L   | L   |
| O | L | O   | O   |
| O | O | O   | O   | which complies with the Boolean equation $$Qt1 = S \cdot R + Q \text{ to} \cdot (S + R).$$

2. Description of the Prior Art

Usually, synchronously controlled ring counters comprise ring connected bistable storage circuits, for example flip-flops, only one of which is respectively marked. The synchronously operating ring counters differ from the asynchronously controlled counters in that all counting flip-flops are subjected to a common timing pulse. With this type of operation, the marked position is shifted by one position in the counting direction after a pulse arrives at the input of the ring counter. Such counting circuits have the advantage that a decoding circuit for indicating the respective counting result is not required since an indicator device can be directly connected to the outputs of the counting flip-flops.

SUMMARY OF THE INVENTION

The primary object of the invention is to provide a synchronously controlled, low-cost ring counter with special counting flip-flops.

According to the invention, the foregoing object is achieved through the utilization of an electronic storage member which includes a master-slave flip-flop with a majority decision input circuit. Such a circuit is described below in the initial portions of the detailed description and has been utilized to great advantage in digital data processing systems having a high error safety, as described in British Letters Pat. No. 1,357,862. This prior art circuit is to be used in the ring counter circuit of the present invention as a counting flip-flop.

BRIEF DESCRIPTION OF THE DRAWINGS

Other objects, features and advantages of the invention, its organization, construction and operation will be best understood from the following detailed description of preferred embodiments of the invention taken in conjunction wth the accompanying drawings, on which.

DESCRIPTION OF THE PREFERRED EMBODIMENTS

Figure 1:
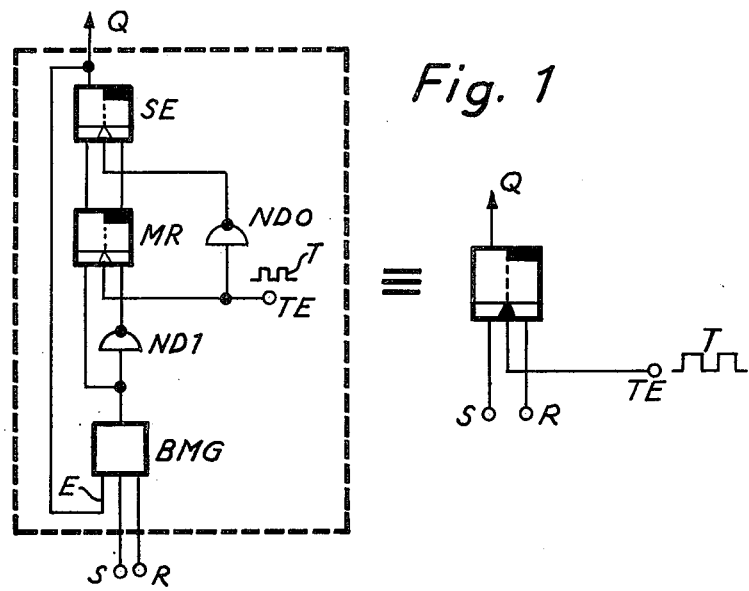
FIG. 1 is a schematic illustration of a memory circuit constructed of a RS master-slave flip-flop including a particular control portion.
Figure 2:
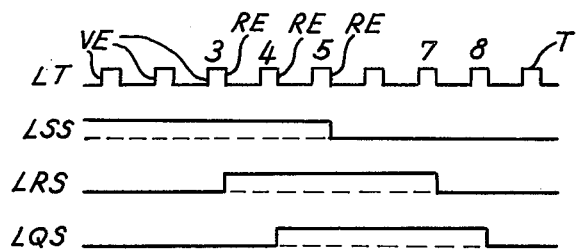
FIG. 2 is a timing diagram of several signal voltages, depending on the logical value of the logical switching variables associated therewith, the values being represented by the respective amplitudes of the signal voltages.
Figure 3:
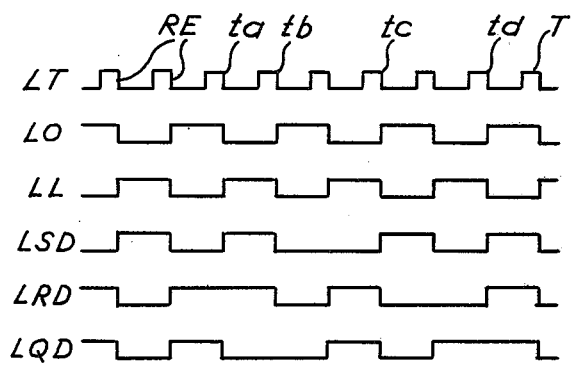
FIG. 3 is a time diagram for rectangular signal voltages for the representation of logical switching variables wherein the logical values of the switching variables are determined by the respective phase positions of the signal voltages, with respect to reference signals.

Referring first to FIGS. 1, 2 and 3, FIG. 1 illustrates a prior art circuit arrangement of an electronic memory circuit for dynamic signals such as illustrated in FIG. 3. As indicated in FIG. 1, the flip-flop of the right hand portion of the figure is equivalent to and may be constructed from the elements shown in the left hand portion.

The memory circuit illustrated essentially comprises an RS master slave flip-flop in which the outputs of the master MR are connected to the inputs of the slave SE. The timing signals T which are required for controlling the master MR and the slave SE are directly supplied to the master MR by way of a timing input TE, and indirectly to the slave SE by way of an inverter NDO. The signal input into the RS master-slave flip-flop is not effected directly at the master MR, as is common practice, but by way of an input control circuit BMG which is connected in front of the master MR and which has three inputs E, S and R. This control circuit has the task of effecting a majority decision of switching variables applied to the three inputs E, S and R in the form of respective signal voltages, in connection with an inversion of the output signal. A circuit for this purpose is, for example, illustrated in FIG. 6. The output signals of the control circuit BMG are directly supplied to the set input of the master MR and indirectly to the reset input by way of an inverter ND1.

It should be pointed out in this connection that, if a control circuit BMG is used, without an output signal inversion, the two input connections to the master MR must be exchanged as compared with the present representation. The output Q of the memory circuit is connected with one of the inputs E of the control circuit BMG by way of a feedback branch. The other two inputs S and R of the control circuit BMG are provided for receiving switching variables having respective logical values which is given either by the amplitude of the signals employed, or by the phase position of rectangular signal voltages, as compared with a given rectangular reference voltage, if the memory is used in a positive or negative logic application. In the latter case concerning rectangular signals, rectangular signal voltages will have a phase difference of 180° when their logical values differ. If static signals (FIG. 2) are used for the switching variables, an inversion must be provided in the feedback branch between the slave SE and the circuit BMG, as compared with that represented in FIG. 1, for example by the use of the other output of the slave for the feedback connection.

The memory circuit which is briefly described hereinabove and which is to be connected into the ring counter in accordance with the invention as a counting flip-flop, is illustrated as a simple time-control flip-flop with two inputs S and R, an output Q and an timing input TE, as illustrated in the right hand portion of FIG. 1, in the exemplary embodiments of the invention in order to simplify the schematic representation of circuits constructed according to the invention.

FIGS. 2 and 3 illustrate the course of the timing signals T for the timing input TE of the memory circuit of FIG. 1, respectively coinciding in the upper diagram line LT. If a leading edge VE of the timing signals T is present, the master MR is set or reset in accordance with the signal configuration present at its set and reset input, respectively, in order to reach the illustrated basic position, It should be pointed out that the master MR and also the slave SE basically reach the illustrated basic position by way of a wide connection during the connection process which is not described in detail. When the master MR is set or reset, respectively, the slave SE remains blocked. The signals emitted by the master MR are respectively transferred to the slave SE during the next trailing edge RE of the respective timing signal.

In digital data processing, the distinction is generally between high and low levels of signal voltages in order to represent the logical values O or L. In the common TTL technique in positive logic, a switching variable with the logical values O is represented in this connection by a signal voltage of approximately zero volts and the logical value L is provided at approximately 3.5 volts. The time curves of signal voltages in the diagram lines LSS, LRS and LQS in FIG. 2 are also valid for positive logic so that the switching variable of the value L is supplied to the input S of the memory circuit in accordance with FIG. 1 (however, in the case of static signals, with an additional inversion before the input E, not illustrated) chronologically until the trailing edge RE of the timing signal 5 having a high signal level is present. In accordance with the diagram line LRS, the reset input R of the memory circuit of FIG. 1 obtains the switching variable of the logical value L, chronologically after the trailing edge of the timing signal 3 until the trailing edge of the timing signal 7, also having a high signal level.

In the case of a low signal level, the conditions reverse for the set input S or the reset input R of the memory circuit. The path of the signal from the output Q is illustrated in the diagram line LQS. This signal has a high signal level from the trailing edge RE of the timing signal 4 up to the trailing edge RE of the timing signal 8 (compare diagram line LT), which corresponds to the variable having the value L. This result can easily be obtained while using the Boolean equation $Qt1 = S \cdot . R + Q$ to $\cdot . (S + R)$, while respectively considering the logical values present at the inputs S and R as well as the respective "old" logical state Qto at the output Q.

In the remaining diagram lines LO, LL, LSD, LRD, and LQD of FIG. 3, rectangular signal voltages are illustrated with a given frequency of repetition. The signals in the lower three diagram lines LDS, LRD, and LQD represent the same logical values as the signals in the diagram lines LSS, LRS and LQS according to FIG. 2 at comparable instances of time. However, the essential difference is provided between the signal paths of FIGS. 2 and 3 that the respective value of the switching variables represented by the curves of FIG. 2 is provided statically by the amplitude and, in the case of the corresponding signal curves of FIG. 3, is provided dynamically through the phase position of the signals. The rectangular signal voltages which are represented in the diagram line LO and LL of FIG. 3 are basically phase shifted with respect to one another about 180° and represent the two possible logical values O and L of the switching variables, and serve as reference signals. The second diagram line LO therefore illustrates the path and the phase position of signal voltages which are present at one or several ones of the inputs S or R are upon the output Q of the memory circuit according to FIG. 1, respectively, in the case of the value O of the switching variable. The diagram line LL illustrates the path of signal voltages which represent the logical values L of the switching variable at the input S and R or at the output Q of the memory circuit, respectively, due to their phase position.

In order to promote an understanding when handling dynamic signals in accordance with FIG. 3, it is assumed for the memory circuit of FIG. 1 that its set input S obtains variables having a time path as illustrated in the diagram LSD. Similar conditions obtain for the reset input R and the signal path of the switching variable in the diagram line LRD, which, for example, is associated with the reset input. The path of the signal at the output Q of the memory circuit, which is associated with these two signals or switching variables, respectively, can be seen in the diagram line LQD.

In order to permit a comparison of the signal configuration in accordance with the diagram lines in FIG. 3, with that for the truth table for the memory circuit, the truth table is again stated at this point as:

| S | R | Qto | Qtl |
|---|---|-----|-----|
| L | O | O | O |
| L | L | O | L |
| O | L | L | L |
| O | O | L | O |
| L | O | L | L |
| L | L | L | L |
| O | L | O | O |
| O | O | O | O | a comparison of the diagram lines LSD, LRD and LQD with the diagram lines LO and LL, in connection with the timing signal of the diagram line LT shows that the input variables have the logical value L until the instant of times ta at the set input S of the memory circuit, and the logical value O at the reset input R, while the value of the signal at the output Q is also O. In the truth table, Qto denotes the old signal state of the output Q of the memory circuit before the slave SE (FIG. 1) of the memory circuit has taken over the signal configuration provided at the inputs S and R of the input control circuit BMG. A value of the output signal which is basically denoted by Qt1 in the truth table is true for the output Q of the memory circuit, respectively, during the trailing edge RE of the next timing signal.

It can be recognized from the diagram line LRD that the switching variable present at the reset input R of the memory circuit, which is present after the time ta changes its logical value from O to L since the signal represented in the diagram line LRD is now in phase with that which is represented in the diagram line LL. The values of the signal configuration assumed in the present operational example, which are provided at the inputs S and R as well as the output Q of the memory circuit can be taken from the second line of the truth table with L and L as well as O for Qto. After the instant tb the memory circuit emits a rectangular signal of the value L at the output Q after a majority decision and a transfer of information to the slave SE. In order to recognize this, the diagram lines LQD and LL are to be compared after the instant tb. It is recognizable that the mentioned signal curves coincide from the instant tb in respect of their phase positions.

After the timing signal which is between the times tb and tc, the value of one of the switching variables, and therefore the corresponding signal at the set input S of the memory circuit will have changed from L to O, as can be seen by comparing the diagram line LSD and line of the truth table. At the time tc, the value L will still be provided at the output Q, as a result of the input variable change, as can be seen from the diagram line LQD in connection with the reference signal in the diagram line LL.

With the values O and O of the input variables for the inputs S and R of the memory circuit, as stated in the last line of the truth table and with the signal of the value L at the output Q, signals are provided after the trailing edge of the timing signal which is positioned between the times tc and td, since the value of the input signal at the reset input R of the memory circuit has changed. In addition, compare the diagram line LRD. As a result of this signal configuration, the slave SE will emit an output signal corresponding to a switching variable with the value O after information transfer at the time td.

A ring counter of the initially mentioned kind is realized in accordance with the objects of this invention while using the prior art memory circuit as a counting flip-flop in an even number of counting flip-flops which are ring-connected by way of their set inputs and the outputs associated therewith. The reset inputs of the counting flip-flops of even order are connected with a first control line and the reset inputs of the counting flip-flops of an uneven order are connected to a second control line. All counting information of the first counting flip-flop are supplied and guided away inverted. A control stage in the form of a binary divider is connected to the first control line and emits counting information thereto which is also provided inverted to the second control line.

Advantageously, the control stage of the ring counter may comprise a memory circuit having the same construction as the flip-flops employed for the counting stages and having information therefrom emitted and guided, on the one hand, to the reset input by way of an input NAND gate, and, on the other hand, inverted to the set input of the memory circuit by way of an AND gate. An input of the NAND gate and an input of the AND gate are interconnected and form the counting pulse input of the control stage.

In a further development of the invention, a measure may advantageously be provided with the help of which a setting of the ring counter from any operational position into the basic position may be provided during the switching-on process of the ring counter. This preferred circuit variation can be realized in an advantageous manner by providing a circuit for a majority decision of three variables, with output signal inversion, as a control stage in the place of the aforementioned NAND gate. In such a circuit configuration the additional input of the majority decision circuit is connected to a basic position control line which is provided to receive basic position reset signals. Otherwise, the majority decision circuit and the AND gate are connected with each other and to the flip-flop as previously described with respect to the AND gate and NAND gate combination. Another AND gate is utilized to receive basic position setting information and is interposed in the ring connection, as will be more specifically set forth below.

All of the ring counter circuits discussed herein have the advantage that they may operate selectively with static signals in accordance with FIG. 2 or with dynamic signals in accordance with FIG. 3. The mode of operation depends only on the "inner" circuitry of the memory circuit in accordance with the left hand portion of FIG. 1. In both cases, the circuits require the same low material expense of additional switching members for controlling the individual counting flip-flops. In addition, a two-channel construction can be effected during an operation of the ring counters with dynamic or static signals in accordance with FIGS. 2 and 3, in accordance with the application of the prior art memory circuit for a two-channel circuitry system. A particularly high error safety results from the application of dynamic signals. In the case of two-channel circuitry systems, an original and a complementary channel exists having non-equivalent (anti-valent or anti-phase) signals. The out of phase condition prevailing during an operation is monitored on both channels.

The application of the ring counter in accordance with the invention in two-channel switching mechanisms also entails a special saving in view of diverse negation circuits, since it is often possible to obtain the required inversion by means of switching over into the complementary channel and omitting an inverter in the original channel.

Several exemplary embodiments of the invention utilizing the construction set forth above are discussed in detail below with the aid of FIGS. 4–7.

Figure 4:
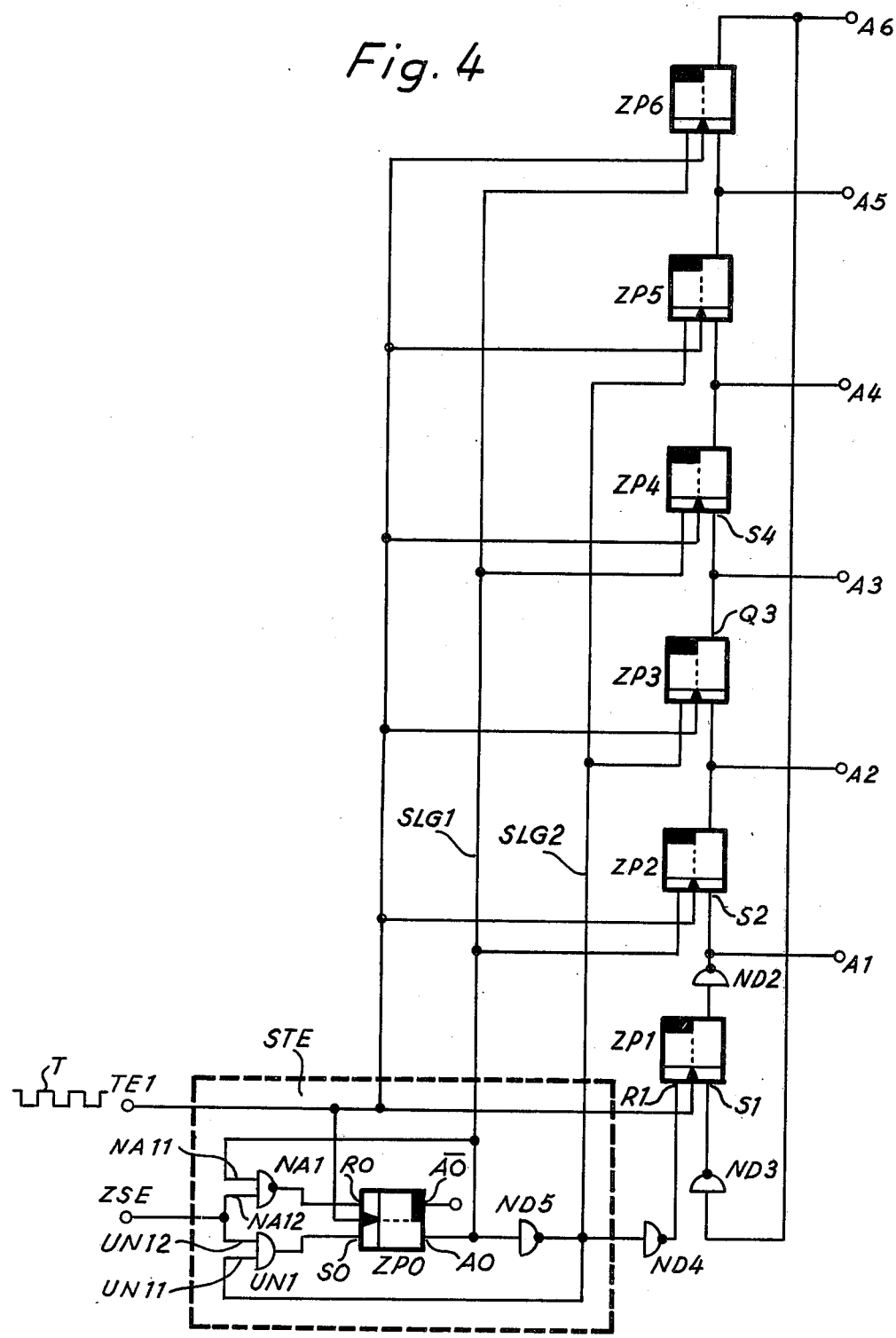
FIG. 4 is a schematic circuit diagram of a ring counter constructed in accordance with the invention.

Referring to FIG. 4, a block circuit diagram illustrates a ring counter comprising an even number of synchronously controlled flip-flops ZP1–ZP6. The outputs of the individual counting stages are denoted by A1–A6. Memory circuits constructed according to FIG. 1 may be utilized as the counting flip-flops. The individual counting flip-flops, with the exception of the first counting flip-flop ZP1, are directly connected with the output of the adjacent counting flip-flop by way of the respective set input, for example S4 in the case of the counting flip-flop ZP4. For example, the output Q3 of the counting flip-flop ZP3 is connected to the set input S4 of the counting flip-flop ZP4. Corresponding circuit relationships are also evident for the other counting flip-flops. An exception to this is provided by the first counting flip-flop ZP1 in that it is not directly connected with the set input S2 of the counting flip-flop ZP2, but is indirectly connected to the set input S2 by way of an inverter ND2. Furthermore, an inverter ND3 is connected before the set input S1 of the counting flip-flop ZP1 in the ring connection from the output of the last counting flip-flop, in this case the flip-flop ZP6.

The reset inputs of all counting flip-flops of an even order, but is the counting flip-flops ZP2, ZP4 and ZP6, are connected to a common control line SLG1 and the reset inputs of the odd order counting flip-flops, that is the counting flip-flops ZP1, ZP3 and ZP5, are connected to a second control line SLG2. The first counting flip-flop ZP1 again forms an exception, since an inverter NG4 is connected between the second control line SLG2 and the reset input R1.

In the case of corresponding counting pulses for the ring counter, the shifting process is effected by way of the two control lines SLG1 and SLG2, therefore exclusively by way of the reset inputs of the counting flip-flops ZP1–ZP6. The counting information present on the control line SLG2 differs exclusively due to an inversion of the information, as compared with that present upon the control line SLG1. The two control lines SLG1 and SLG2 are connected to a control stage STE.

The control stage STE may advantageously be provided in the form of a binary divider which, in a preferred manner, also comprises a memory circuit constructed in accordance with FIG. 1. While the control conductor SLG1 is directly connected with the output AO of the memory circuit ZPO in the control stage STE, the second control line SLG2 is connected with the output AO by way of a further inverter ND5, due to the required output signal inversion.

If the electric properties of the memory circuit ZPO permit, it is also possible to connect the control line SLG2 with the output $\overline{AO}$, in an advantageous manner, while omitting the inverter ND5. It might furthermore be desirable that, in the case of a possible twochannel construction with a complementary mode of operation of the two channels and while assuming that the arrangement in accordance with FIG. 4 represents the original channel, the control line SLG2 is connected to the control stage of the complementary channel, while omitting the inverter ND5. This advantageous circuit measure also causes a lowering of otherwise required component parts.

In addition to the previously mentioned memory circuit ZPO and the inverter ND5, the control stage STE comprises a NAND gate NA1 having two inputs and an output which is connected to the reset input RO of the memory circuit ZPO, and an AND gate UN1, also having two inputs UN11 and UN12 and an output which is connected to the second input SO of the memory circuit ZPO. One of the inputs NA11 of the NAND gate NA1 is connected with the output AO of the flip-flop ZPO. Therefore the NAND circuit NA1 obtains the same counting information as one of the control lines SLG1. One input UN11 of the AND circuit UN1 is connected with the output of the inverter ND5 and therefore obtains the inverted counting information from the memory circuit ZPO just as the second control line SLG2. The second input NA12 of the NAND gate NA1 and the second input UN12 of the AND gate UN1 are interconnected and form a counting input ZSE of the ring counter for receiving the pulses to be counted. The timing signals T, which are required for synchronous operation, are supplied for all of the flip-flops ZPO and ZP1–ZP6 by way of a timing input TE1.

Since the basic mode of operation of the ring counter circuits are well known to those skilled in the art, it is not necessary to completely describe this operation. Therefore, only a few particularities are explained herein with respect to the arrangement of FIG. 4, which are not common in prior art circuits.

After switching on the ring counter of FIG. 4, the flip-flops ZPO and ZP1–ZP6 are in the marked basic position, due to the respective internal wiring. Due to the inversion of signals by the inverted ND2, the value L is emitted by way of the output A1 since a marking of the first counting flip-flop ZP1 is to represent the initial position, in the basic position of the ring counter. This mark is switched forward from counting stage to counting stage, respectively at the leading and trailing edges of a counting pulse emitted from the output AO of the flip-flop ZPO. This type of switching forward of the individual counting bit in the ring counter would cause a doubling of the number of counting pulses, if the control stage STE was not present. In order to balance this, the control stage STE is provided in the form of a binary divider. Due to this construction, nearly half of the counting pulses supplied by way of the input ZSE are made available to the ring counter itself which comprises the counting flip-flops ZP1–ZP6.

If a continuous signal with the value L is placed at the input ZSE, the output AO of the flip-flop ZPO will emit a full period of a rectangular signal after respectively two timing signals applied by way of the input TE1, and this rectangular signal is also transferred to the counting flip-flops ZP1–ZP6. From the foregoing, it can be seen that a static signal can be easily converted into a pulse train with the help of the second arrangement constructed in accordance with FIG. 4.

Figure 5:
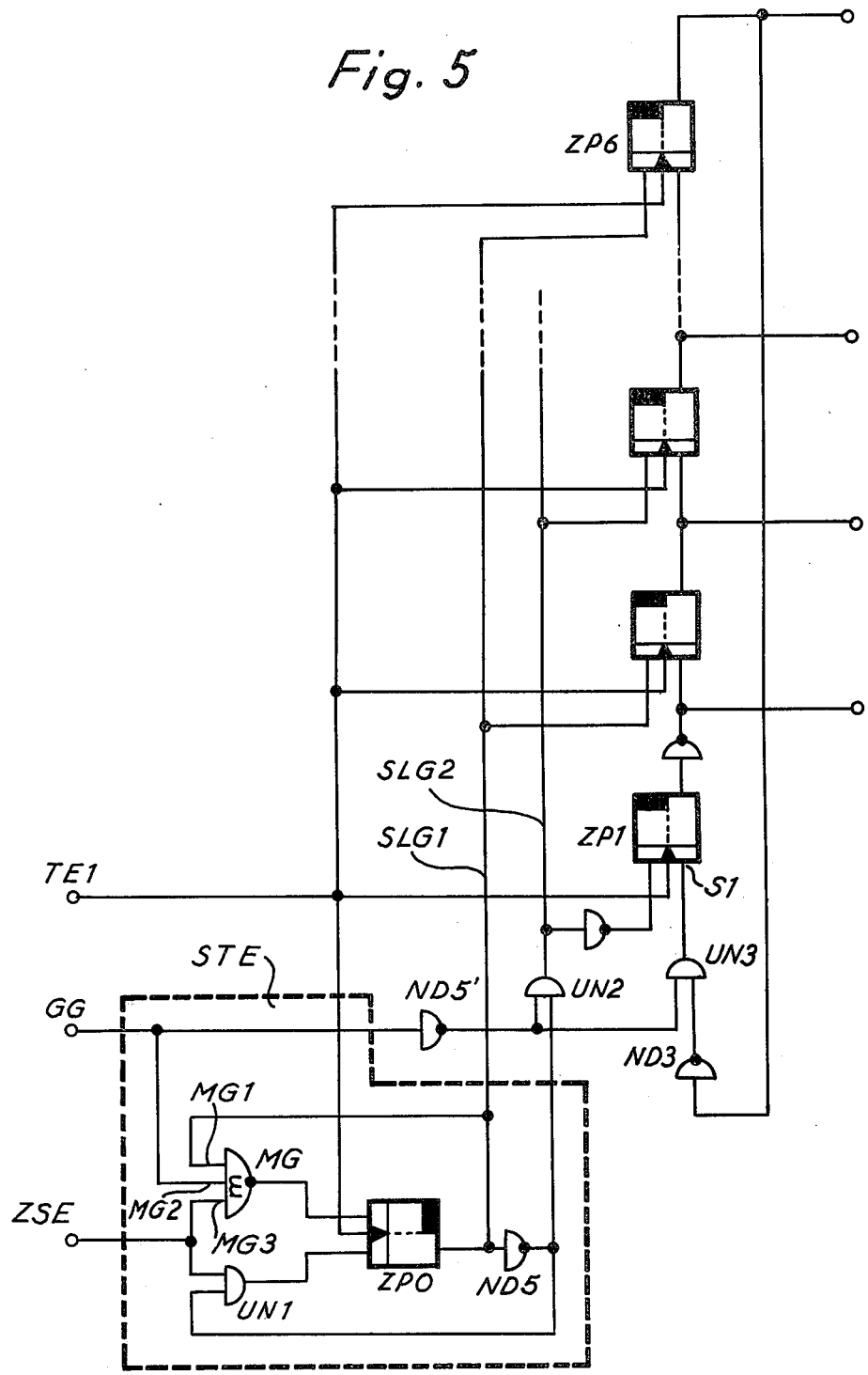
FIG. 5 is a schematic circuit diagram of a ring counter constructed in accordance with the invention.

FIG. 5 illustrates a circuit arrangement of a ring counter in a somewhat simplified manner whereby not all counting flip-flops have been shown. The same reference numerals have been elected for those component groups in component parts of the circuit arrangement of FIG. 5 which were already described for the arrangement of FIG. 4. The essential difference between the ring counter of FIG. 5 and the ring counter of FIG. 4 is that the circuit arrangement of FIG. 5 provides the possibility for adjusting the ring counter from any existing counting position into the basic position. For this reason, a majority decision circuit for three variables with output signal inversion is provided in the place of the NAND gate NA1 of the circuit arrangement of FIG. 4 and therefore has the same function. The additional input MG2 of the majority decision circuit MG forms the basic set input GG which is connected with two additional AND gates UN2 and UN3 by way of an inverter ND5'. The output of the inverter ND5' is connected to the second input of the AND gate UN2 and the output of the AND gate is connected with the second control line SLG2. The output of the last counting flip-flop ZP6 is connected to the set input S1 of the first counting flip-flop ZP1 by way of an inverter ND3 and, in addition, by way of the AND gate UN3.

In order to adjust the basic position of the entire circuit arrangement in accordance with FIG. 5, a basic setting signal with the value L is placed at the basic setting input GG. This will first of all obtain the basic position of the memory circuit ZP0; furthermore, the AND circuits UN2 and UN3 are blocked for the duration of the basic setting signal, due to the inversion caused by the inverter ND5'. If the memory circuit ZP0 is not in its basic position when the basic position setting signal is supplied, the circuit MG will respectively obtain a signal of the value L for the majority decision at the inputs MG1 and MG2. A signal of the value O for the reset input of the memory circuit ZPO results as an output signal of the majority decision circuit MG due to the majority decision and signal inversion. Since the memory circuit ZPO also provides a signal toward the inverter ND5 the setting input of the memory circuit ZPO is also charged with a signal of the logical value O after the linkage thereof to that input by way of the AND gate UN1. The majority decision illustrates that the memory circuit ZPO attains thhe basic position due to the assumed signal states. Hereafter, both of the control lines SLG1 and SLG2 have a signal of the value O since the AND gate UN2 is also blocked. Furthermore, a signal with the logical value 0 is produced at the set input S1 of the first counting flip-flop ZP1 by way of the AND gate UN3. This causes all of the flip-flops of the circuit arrangement of FIG. 5 to reach the basic position in the case of a simultaneous presence of a basic position signal after two timing signals by way of the input TE1 at the latest.

Figures 6, 7:
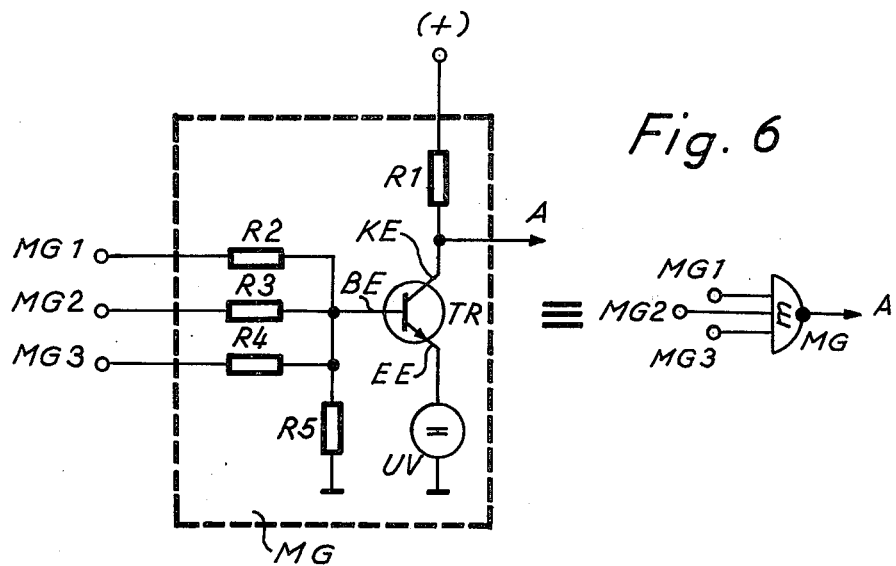
FIG. 6 is a schematic circuit diagram of a majority decision circuit which may be utilized in practicing the invention.
FIG. 7 is a truth table for a circuit constructed in accordance with the information of FIG. 6.

The circuit arrangement of FIG. 6 is provided for a further explanation of a preferred embodiment for the majority decision circuit MG for performing a majority decision of three variables. The left hand portion of FIG. 6 illustrates the individual circuit components for constructing a majority decision circuit and the equivalent logical symbol for the majority decision circuit is illustrated in the right hand portion of FIG. 6.

The majority decision circuit MG essentially comprises a transistor TR having a collector KE which is connected to a positive potential by way of a load resistor R1. The base electrode BE of the transistor TR is connected to a resistance network formed of three further resistances R2, R3 and R4 having three inputs MG1, MG2 and MG3 connected to respective terminals thereof. Furthermore, the base electrode BE is connected to ground potential by way of a further resistor R5. The emitter electrode EE is connected to a potential greater than ground. This is indicated by a voltage source UV. The result of a majority decision of three values of switching variables which are supplied by way of the inputs MG1, MG2 and MG3 is emitted in an inverted form at the output A. The transistor TR will switch through when the voltage drop at the resistor R5 (at the base BE) is greater than the voltage of the voltage source UV, increased by the threshold voltage between the base electrode and the emitter electrode.

In the truth table according to FIG. 7, the reference numerals of the inputs MG1, MG2 and MG3, as well as the reference numeral of the output A have been applied from the majority decision circuit MG of FIG. 6. It is assumed in block I that the base setting signal for the input GG of the circuit arrangement in accordance with FIG. 5 is not present; therefore, the value O is provided, as can be seen by comparing the column under the reference MG2. The comparison of the values for the inputs MG2 and MG3 with the linkage result reveals rather easily that the majority decision circuit MG operates for majority decisions as the NAND gate NA1 in the circuit arrangement of FIG. 4, in the case of a non-present basic setting signal and therefore a value O at the input GG (FIG. 5) or MG2 (FIG. 7) respectively. If, however, the basic setting signal is provided, and therefore a signal with the value L is applied at the input GG of the circuit arrangement constructed in accordance with FIG. 5, the block II of the truth table of FIG. 7 will be valid. A combination of the various values of switching variables at the inputs MG1, MG2 and MG3, as compared with the linkage results, reveals that a NOR function is fulfilled by the majority decision circuit MG.

Although I have described my invention by reference to particular illustrative embodiments thereof, many changes and modifications of the invention may become apparent to those skilled in the art without departing from the spirit and scope of the invention. I therefore intend to inlcude within the patent warranted hereon all such changes and modifications as may reasonably and properly be included within the scope of my contribution to the art.

I claim:

1. A ring counter comprising:
   an even numbered plurality of master-slave counter flip-flops connected in a counting ring and each including a set input S, a reset input R, a timing input and an output Q and operable to filfill the truth table

| S | R | Qto | Qtl |
|---|---|-----|-----|
| L | O | O | O |
| L | L | O | L |
| O | L | L | L |
| O | O | L | O |
| L | O | L | L |
| L | L | L | L |
| O | L | O | O |
| O | O | O | O | which complies with the Boolean equation $$Qtl = S \cdot R + Q\, to \cdot (S + R)$$

where Qto is the logical condition of the output Q prior to new information transfer in a counter flip-flop and Qtl is the logical condition resulting after such information transfer,
   the output of a counter flip-flop connected to the set input of the next following counter flip-flop of the counting ring;
   first and second control lines respectively connected to the reset input of alternate ones of said counter flip-flops;
   a timing pulse line for receiving periodic timing pulses, said timing pulse line connected to said timing inputs of said counter flip-flops;
   a control stage including a binary divider, a counting pulse input for receiving counting pulses a timing pulse input connected to said timing pulse line, and first and second outputs and operable in response to the counting pulses to provide a divided count pulses to said first output and inverted divided count pulses to said second output.

2. A ring counter according to claim 1, wherein said control stage comprises:
   a master slave storage flip flop of the same structure as said counter flip-flops and including a set input, a reset input a timing pulse input connected to said timing pulse line and an output connected to said first control line;
   an inverter having an input connected to said output of said storage flip-flop and an output connected to said second control line;
   a NAND gate including a first input connected to said output of said storage flip-flop, a second input, and an output connected to said reset input of said storage flip-flop; and an AND gate including a first input connected to said output of said inverter, a second input connected to said second input of said NAND gate and serving as said counting pulse input, and an output connected to said set input of said storage flip-flop.

3. A ring counter according to claim 2, comprising:
- a second inverter connected between the first mentioned inverter and the reset input of the first counter flip-flop of the ring;
- a third inverter interposed in the connection between the last flip-flop of the ring and the set input of the first flip-flop of the ring; and
- a fourth inverter interposed in the connection between the output of the first flip-flop of the ring and the set input of the second flip-flop of the ring.

4. A ring counter according to claim 1, wherein said control stage comprises:
- a master-slave storage flip-flop of the same structure as said counter flip-flops and including a set input, a reset input, a timing pulse input connected to said timing pulse line and an output connected to said first control line;
- a first inverter having an input connected to said output of said storage flip-flop, and an output;
- a basic position control line for receiving a basic position setting signal;
- a first AND gate including a first input connected to said output of said first inverter, a second input, and an output connected to said set input of said storage flip-flop;
- a majority decision circuit including a first input connected to said output of said storage flip-flop, a second input connected in common with said second input of said first AND gate and serving as said counting pulse input, and a third input connected to said basic position control line;
- a second inverter including an input connected to said basic position control line, and an output;
- a second AND gate including a first input connected to said output of said second inverter, a second input connected to said output of said first inverter and an output connected to said second control line;
- a third AND gate interposed in the ring and including a first input connected to said output of said second inverter, a second input, and an output connected to said set input of the first counter flip-flop of the ring; and
- a third inverter connected between said output of the last flip-flop of the ring and said second input of said third AND gate.

5. A ring counter according to claim 4, comprising:
- a fourth inverter including an input connected to said second control line and an output connected to said reset input of the first flip-flop of the ring; and
- a fifth inverter including an input connected to said output of the first flip-flop of the ring and an output connected to said set input of the second flip-flop of the ring.

* * * * *